US012781342B2

(12) United States Patent
Narasimhan et al.

(10) Patent No.: US 12,781,342 B2
(45) Date of Patent: Nov. 3, 2026

(54) INHERENTLY FERROELECTRIC Hf—Zr CONTAINING FILMS

(71) Applicant: Merck Patent GmbH, Darmstadt (DE)

(72) Inventors: Vijay Kris Narasimhan, Mountain View, CA (US); Jean-Sébastien Lehn, Winchester, MA (US); Karl Littau, Palo Alto, CA (US); Jacob Woodruff, Lexintogn, MA (US); Ravindra Kanjolia, North Andover, MA (US)

(73) Assignee: Merck Patent GmbH, Darmstadt (DE)

(*) Notice: Subject to any disclaimer, the term of this patent is extended or adjusted under 35 U.S.C. 154(b) by 466 days.

(21) Appl. No.: 17/907,107

(22) PCT Filed: Jun. 15, 2021

(86) PCT No.: PCT/EP2021/066028
§ 371 (c)(1),
(2) Date: Sep. 23, 2022

(87) PCT Pub. No.: WO2021/254989
PCT Pub. Date: Dec. 23, 2021

(65) Prior Publication Data

US 2023/0089523 A1 Mar. 23, 2023

Related U.S. Application Data

(60) Provisional application No. 63/040,097, filed on Jun. 17, 2020.

(51) Int. Cl.

| | |
|---|---|
| ***C23C 16/40*** | (2006.01) |
| ***C23C 16/455*** | (2006.01) |
| *H10D 1/68* | (2025.01) |

(52) U.S. Cl.
CPC ...... *C23C 16/405* (2013.01); *C23C 16/45531* (2013.01); *C23C 16/45553* (2013.01); *H10D 1/68* (2025.01)

(58) Field of Classification Search
CPC .................... H01L 21/02181; H01L 21/02189
See application file for complete search history.

(56) References Cited

U.S. PATENT DOCUMENTS

| | | | |
|---|---|---|---|
| 8,568,530 | B2 | 10/2013 | Heys et al. |
| 2008/0176375 | A1 | 7/2008 | Erben et al. |

(Continued)

FOREIGN PATENT DOCUMENTS

| | | | |
|---|---|---|---|
| CN | 101460657 | A | 6/2009 |
| CN | 107134487 | A | 9/2017 |

(Continued)

OTHER PUBLICATIONS

Barabash, S.V. , "Prediction of new metastable HfO2 phases: toward understanding ferro-and antiferroelectric films", Journal of Computational Electronics, vol. 16, Nov. 13, 2017, pp. 1227-1235.

(Continued)

*Primary Examiner* — Alexandre F Ferre
(74) *Attorney, Agent, or Firm* — Versum Materials US, LLC; Daniel Roth

(57) ABSTRACT

The disclosed and claimed subject matter relates to crystalline ferroelectric materials that include a mixture of hafnium oxide and zirconium oxide having a substantial (i.e., approximately 40% or more) or majority portion of the material in a ferroelectric phase as deposited (i.e., without the need for further processing, such as a subsequent capping or annealing) and methods for preparing and depositing these materials.

11 Claims, 5 Drawing Sheets

(56) References Cited

U.S. PATENT DOCUMENTS

| | | | |
|---|---|---|---|
| 2009/0311879 | A1 | 12/2009 | Blasco et al. |
| 2014/0355328 | A1 | 12/2014 | Muller et al. |
| 2015/0076437 | A1 | 3/2015 | Tao et al. |
| 2016/0181091 | A1 | 6/2016 | Niyogi et al. |
| 2019/0019683 | A1 | 1/2019 | Yoo |
| 2019/0019801 | A1 | 1/2019 | Yoo |
| 2019/0067488 | A1 | 2/2019 | Tsai et al. |
| 2019/0131383 | A1 | 5/2019 | Frank et al. |
| 2019/0148390 | A1 | 5/2019 | Frank |
| 2019/0244973 | A1 | 8/2019 | Yoo |
| 2020/0020762 | A1 | 1/2020 | Frank et al. |
| 2020/0035493 | A1 | 1/2020 | Clark et al. |
| 2022/0178012 | A1 | 6/2022 | Funakubo et al. |

FOREIGN PATENT DOCUMENTS

| | | | |
|---|---|---|---|
| CN | 109518163 | A | 3/2019 |
| CN | 110165053 | A | 8/2019 |
| CN | 110718447 | A | 1/2020 |
| CN | 111081538 | A | 4/2020 |
| WO | 2007/140813 | A1 | 12/2007 |
| WO | WO-2018231210 | A1 * | 12/2018 |
| WO | 2020/218617 | A1 | 10/2020 |
| WO | 2021/254989 | A1 | 12/2021 |

OTHER PUBLICATIONS

Cao et al., "Effects of capping electrode on ferroelectric properties of Hf 0.5 Zr 0.5 O 2 thin films", IEEE Electron Device Letters, vol. 39, No. 8, Aug. 2018, pp. 1207-1210.

Dezelah IV et al., "The atomic layer deposition of HfO2 and ZrO2 using advanced metallocene precursors and H2O as the oxygen source", Chemical Vapor Deposition, vol. 14, No. 11-12, Dec. 16, 2008, pp. 358-365.

George et al., "Surface Chemistry for Atomic Layer Growth", The Journal of Physical Chemistry, vol. 100, No. 31, May 8, 1996, pp. 13121-13131.

Hamouda et al., "Physical chemistry of the TiN/Hf0.5Zr0.5O2 interface", Journal of Applied Physics, vol. 127, No. 6, Feb. 11, 2020, 64105-1-64105-9.

Jones et al., "Overview of Chemical Vapour Deposition: Precursors, Processes and Applications", The Royal Society of Chemistry, Cambridge, Chapter 1, 2009, pp. 1-36.

Lamperti et al., "Cubic/Tetragonal Phase Stabilization in High-κ ZrO2 Thin Films Grown Using O3-Based Atomic ayer Deposition", Journal of the Electrochemical Society, vol. 158, No. 10,, Aug. 18, 2011, pp. G221-G226.

Li et al., "A ferroelectric thin film transistor based on annealing-free HfZrO film", IEEE Journal of the Electron Devices Society, vol. 5, No. 5, Jul. 26, 2017, pp. 378-383.

Materano et al., "HfxZr1—xO2 thin films for semiconductor applications: An Hf- and Zr-ALD precursor comparison", Journal of Vacuum Science & Technology A, vol. 38, No. 2, Jan. 10, 2020, pp. 022402-1-022402-7.

Mcbriarty et al., "Crystal Phase Distribution and Ferroelectricity in Ultrathin HfO 2—ZrO 2 Bilayers", Physica status solidi B, vol. 257, No. 1, 2019, pp. 1900285-1-1900285-10.

Müller et al., "Ferroelectricity in Simple Binary ZrO2 and HfO2", Nano letters, vol. 12, No. 8, 2012, pp. 4318-4323.

Müller et al., "Ferroelectricity in yttrium-doped hafnium oxide", Journal of Applied Physics, vol. 110, No. 11, Dec. 7, 2011, pp. 114113-1-114113-5.

Pal et al., "Emergence of a weak topological insulator from the BixSey family", Applied Physics Letters, vol. 110, No. 16, Apr. 19, 2017, pp. 162102-1-162102-5.

Park et al., "Review and perspective on ferroelectric HfO2-based thin films for memory applications", Mrs Communications, vol. 8, No. 3, 2018, pp. 795-808.

International Search Report and Written Opinion received for PCT Application No. PCT/EP2021/066028, mailed on Sep. 29, 2021, 13 Pages.

Polakowski et al., "Ferroelectricity in undoped hafnium oxide", Applied Physics Letters, vol. 106, No. 23, Jun. 10, 2015, pp. 232905-1-232905-5.

Weeks et al., "Engineering of ferroelectric HfO2—ZrO2 nanolaminates", ACS Applied Materials & Interfaces, vol. 9, No. 15, Mar. 24, 2017, pp. 13440-13447.

Wei et al., "A rhombohedral ferroelectric phase in epitaxially strained Hf0. 5Zr0. 5O2 thin films", Nature materials, vol. 17, No. 12, Dec. 2018, pp. 1095-1100.

Onaya, et al., "Ferroelectricity of HfxZr1—xO2 thin films fabricated by 300° C. low temperature process with plasma-enhanced atomic layer deposition", Microelectronic Engineering, vol. 215,, Jul. 15, 2019, pp. 1-5 (111013).

Park, et al., "Understanding the formation of the metastable ferroelectric phase in hafnia-zirconia solid solution thin films", Nanoscale, vol. 10, No. 2, Jan. 1, 2018, pp. 716-725.

"International Preliminary Report on Patentability received for PCT Application No. PCT/EP2021/066028, mailing date Dec. 29, 2022", 10 Pages.

* cited by examiner

INHERENTLY FERROELECTRIC Hf—Zr CONTAINING FILMS

This application is a national stage application, filed under 35 U.S.C. § 371, of International Patent Application No. PCT/EP2021/066028 (filed on 15 Jun. 2021) which claims the benefit of U.S. Provisional Patent Application No. 63/040,097 (filed on 17 Jun. 2020) each of which applications is incorporated herein by reference in their entirety.

FIELD

The disclosed and claimed subject matter relates generally to ferroelectric materials deposited using vapor techniques, including atomic layer deposition (ALD). More specifically, the disclosed and claimed subject matter relates to thin film crystalline ferroelectric materials that include a mixture of hafnium oxide and zirconium oxide having a substantial (i.e., approximately 40% or more) portion of the material in a ferroelectric phase and methods for preparing and depositing these materials. Significantly, these materials exhibit ferroelectric properties without the need for further processing, such as a subsequent capping or annealing.

BACKGROUND

Hafnium and zirconium oxide-based ferroelectric materials enable a variety of computing devices, including non-volatile memories and power-efficient logic devices, owing to their strong non-linear capacitance and remanent polarization. These materials may also be useful for a variety of other thermal and magnetic applications. Materials containing hafnium oxide and zirconium oxide are highly desirable for these applications owing to their compatibility with many CMOS fabrication processes and materials. They are also desirable owing to their ability to be deposited as thin films from the vapor phase, including by ALD processes involving the stepwise introduction and removal of a precursor followed by the introduction and removal of a reactant gas and other known processes (e.g., chemical vapor deposition (CVD) or pulsed CVD). Hafnium and zirconium oxide-based materials are polymorphic. Thus, their atoms can be arranged in several crystal structures (i.e., different ordered atomic arrangements). It is well known that the most stable bulk structure of hafnium and zirconium oxide-based materials is a monoclinic phase (FIG. 7A); however, this phase does not support ferroelectricity. Other polymorphs (e.g., some orthorhombic (FIG. 7B) and rhombohedral phases (FIG. 7C)) have the symmetry required to support ferroelectric switching behavior, while still others (e.g., a tetragonal phase (FIG. 7D) common in zirconium oxide thin films) can be anti-ferroelectric-like. The listing of related art attached hereto identifies reference materials describing these general features and aspects of the art in more detail.

In many vapor and atomic layer deposition processes for mixed hafnium oxide and zirconium oxide materials, the materials are amorphous as deposited. For example, in FIG. 1 section A illustrates the grazing-incidence x-ray diffraction (GIXRD) pattern for a 7 nm film material composed of alternating atomic layer deposited $Hf_{0.45}Zr_{0.55}O_2$ from amide-type precursors and ozone at 285° C. This GIXRD pattern shows no strong crystalline peaks in the as deposited material.

Even with thermal treatment, crystallization into monoclinic or other non-ferroelectric phases is common, and thereby reduces the fraction of the material capable of ferroelectric behavior. For example, in FIG. 1 section B illustrates the same material as illustrated in section A following a thermal annealing treatment at 500° C. in nitrogen for 10 minutes. The material has a dominant monoclinic phase (as evidenced by the peak area between 2θ of 27° and) 30°) mixed with other phases that could be ferroelectric or anti-ferroelectric (as evidenced by the peak areas between 2θ of 30° and 32°).

Several techniques have been developed to suppress the monoclinic phase in favor of phases that can support ferroelectricity. For example, incorporating other elements (including but not limited to Si, Al, Gd, La, and Y) into the material by sequential or concomitant introduction of precursors for the other elements into the vapor phase has been reported as a means of suppressing the monoclinic phase. Further, thermal treatment in the presence of a capping layer has been shown to be effective. For example, in FIG. 1 section C illustrates the same material as the one illustrated in section A that has been capped with a 5 nm thick PVD titanium nitride layer and then thermally processed at 500° C. in nitrogen for 10 minutes. Unlike the uncapped film shown in section B, the capped film of section C shows almost complete suppression of the monoclinic phase (as evidenced by the peak area between 2θ of 27° and 30°).

One study has shown that thick films (ca. 30 nm) of hafnium and zirconium oxide can demonstrate weak ferroelectricity from a ferroelectric phase. See Y. Li et al, "A Ferroelectric Thin Film Transistor Based on Annealing-Free HfZrO Film," in IEEE Journal of the Electron Devices Society, vol. 5, no. 5, pp. 378-383, September 2017, doi: 10.1109/JEDS.2017.2732166. It appears that this behavior comes about due to the reduction of surface energy effects as compared to thinner films and the prolonged exposure to heat, which acts as a functional equivalent to annealing, in order to generate a film of such thickness. However, this study acknowledges what is generally known in the art: that thin films (ca. 20 nm or less) will not exhibit ferroelectric behavior absent annealing at elevated temperatures (either alone or combined with doping) and the capping approaches mentioned above.

Therefore, obtaining a desired ferroelectric phase traditionally depends on a complicated and complex combination of (i) the deposition conditions of the material itself, (ii) the choice of dopants, interfaces, importantly the top interface and (iii) thermal treatments after deposition. As can be easily appreciated, this combination of factors places significant limitations on the usefulness of such materials with respect to possible substrates, interlayers, electrodes, compositions and processes. Indeed, the thermal profile in devices implementing such ferroelectric materials may not be compatible with all necessary or desirable applications for which ferroelectric materials may be useful. For example, it has been observed that specific electrodes may be needed to modulate electronic work functions, that interfaces may be needed to create barrier layers against chemical reactions and atomic diffusion, and that thermal processing conditions may be limited by stresses introduced in other layers in a multilayer stack.

The inherently ferroelectric thin film materials disclosed here, and the methods of their use, address the forgoing issues. In doing so, the materials and methods described herein reduce processing time making them especially amenable to the demands of current manufacturing procedures. Those skilled in the art can readily appreciate the potential for subsequent optimization of interfaces, electrodes, and thermal processing conditions after deposition of these materials.

SUMMARY

In one aspect, the disclosed subject matter relates to ferroelectric thin film materials derived from a mixture of hafnium oxide and zirconium oxide, deposited from vapor, having a substantial volume fraction of a ferroelectric phase as deposited (i.e., without further annealing and/or capping) and as measured by a phase determining technique or electrical testing known to those skilled in the art (e.g., x-ray diffraction (XRD), x-ray absorption spectroscopy (XAS), transmission electron microscopy (TEM), polarization-voltage or polarization-electrical field testing, piezo force microscopy, or combinations thereof). In a further aspect, the ferroelectric materials have a majority volume fraction of a ferroelectric phase as deposited.

In another aspect, the materials exhibit ferroelectric properties as thin films of approximately 20 nm or less. In a further aspect the materials exhibit ferroelectric properties as thin films of approximately 15 nm or less. In a further aspect, the materials exhibit ferroelectric properties as thin films of approximately 10 nm or less. In a further aspect, the materials exhibit ferroelectric properties as thin films of approximately 5 nm or less. In a further aspect, the materials exhibit ferroelectric properties as thin films of approximately 3 nm or less. In a further aspect, the materials exhibit ferroelectric properties as thin films of approximately 1 nm or less. In a further aspect, the materials exhibit ferroelectric properties as thin films of approximately 0.5 nm or less. In a further aspect, the materials exhibit ferroelectric properties as thin films of approximately 0.2 nm or less. In a further aspect, the materials exhibit ferroelectric properties as thin films of between approximately 0.2 nm to approximately 20 nm. In a further aspect, the materials exhibit ferroelectric properties as thin films of between approximately 0.2 nm to approximately 15 nm. In a further aspect, the materials exhibit ferroelectric properties as thin films of between approximately 0.2 nm to approximately 10 nm. In a further aspect, the materials exhibit ferroelectric properties as thin films of between approximately 0.2 nm to approximately 5 nm. In a further aspect, the materials exhibit ferroelectric properties as thin films of between approximately 0.2 nm to approximately 3 nm. In a further aspect, the materials exhibit ferroelectric properties as thin films of between approximately 0.2 nm to approximately 1 nm. In a further aspect, the materials exhibit ferroelectric properties as thin films of between approximately 0.2 nm to approximately 0.5 nm.

In another aspect, the ferroelectric materials are derived from advanced metallocene precursors having the Formula I ("($R^1$-Cp)($R^2$-Cp)-M-($OR^3$)($R^4$)") where Cp is a cyclopentadienyl group) and/or Formula II ("($R^5$-Cp)($R^6$-Cp)-M-($R^7$)($R^8$)") where Cp is a cyclopentadienyl group):

I

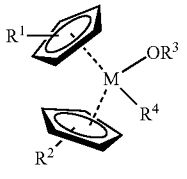

II

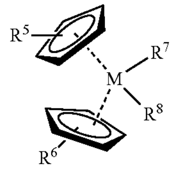

where: M=Zr or Hf; and $R^1$, $R^2$, $R^3$, $R^4$, $R^5$, $R^6$, $R^7$ and $R^8$ are each independently selected from a $C_1$-$C_6$ linear alkyl, a $C_1$-$C_6$ branched alkyl, a $C_1$-$C_6$ halogenated linear alkyl and a $C_1$-$C_6$ halogenated branched alkyl.

In another aspect, in Formula I each of $R^1$, $R^2$, $R^3$, $R^4$, $R^5$, $R^6$, $R^7$ and $R^8$ is preferably a $C_1$-$C_6$ linear alkyl. In a further aspect, in Formula I each of $R^1$, $R^2$, $R^3$, $R^4$, $R^5$, $R^6$, $R^7$ and $R^8$ is preferably the same $C_1$-$C_6$ linear alkyl. In a further aspect, in Formula I each of $R^1$, $R^2$, $R^3$, $R^4$, $R^5$, $R^6$, $R^7$ and $R^8$ is preferably a methyl group. In a further aspect, in Formula I each of $R^1$, $R^2$, $R^3$, $R^4$, $R^5$, $R^6$, $R^7$ and $R^8$ is preferably an ethyl group. In a further aspect, in Formula I each of $R^1$, $R^2$, $R^5$ and $R^6$ is preferably an ethyl group. In a further aspect, in Formula I each of $R^3$, $R^4$, $R^7$ and $R^8$ is preferably a methyl group. In a further aspect, in Formula I each of $R^1$, $R^2$, $R^5$ and $R^6$ is preferably an ethyl group and each of $R^3$, $R^4$, $R^7$ and $R^8$ is preferably a methyl group.

In another aspect, in Formula II each of $R^1$, $R^2$, $R^3$, $R^4$, $R^5$, $R^6$, $R^7$ and $R^8$ is preferably a $C_1$-$C_6$ linear alkyl. In a further aspect, in Formula II each of $R^1$, $R^2$, $R^3$, $R^4$, $R^5$, $R^6$, $R^7$ and $R^8$ is preferably the same $C_1$-$C_6$ linear alkyl. In a further aspect, in Formula II each of $R^1$, $R^2$, $R^3$, $R^4$, $R^5$, $R^6$, $R^7$ and $R^8$ is preferably a methyl group. In a further aspect, in Formula II each of $R^1$, $R^2$, $R^3$, $R^4$, $R^5$, $R^6$, $R^7$ and $R^8$ is preferably an ethyl group. In a further aspect, in Formula II each of $R^1$, $R^2$, $R^5$, and $R^6$ is preferably an ethyl group. In a further aspect, in Formula II each of $R^3$, $R^4$, $R^7$ and $R^8$ is preferably a methyl group. In a further aspect, in Formula II each of $R^1$, $R^2$, $R^5$ and $R^6$ is preferably an ethyl group and each of $R^3$, $R^4$, $R^7$ and $R^8$ is preferably a methyl group.

In another aspect, the advanced metallocene precursor is one or more of $(MeCp)_2Zr(OMe)Me$, $(MeCp)_2Hf(OMe)Me$, $(MeCp)_2Zr(Me)_2$, $(MeCp)_2Hf(Me)_2$, $(EtCp)_2Zr(OMe)Me$, $(EtCp)_2Hf(OMe)Me$, $(EtCp)_2Zr(Me)_2$, $(EtCp)_2Hf(Me)_2$ and combinations thereof.

In another aspect, the advanced metallocene precursor is one or more mixture of $(MeCp)_2Zr(OMe)Me$ and $(MeCp)_2Hf(OMe)Me$, a mixture of $(MeCp)_2Hf(Me)_2$ and $(MeCp)_2Hf(Me)_2$, $(EtCp)_2Zr(OMe)Me$ and $(EtCp)_2Hf(OMe)Me$ and a mixture of $(EtCp)_2Hf(Me)_2$ and $(EtCp)_2Hf(Me)_2$.

In another aspect, the advanced metallocene precursor is one or more of the precursors disclosed and/or claimed in U.S. Pat. No. 8,568,530 the contents of which is incorporated herein in its entirety.

In another aspect, the disclosed subject matter provides a method for preparing and depositing the ferroelectric thin film materials on a substrate using vapor techniques. In a further aspect, the ferroelectric materials on a substrate by and ALD process and/or other known deposition processes (e.g., CVD, pulsed CVD). In a further aspect, the method uses a reaction gas containing one or more of oxygen (e.g., ozone, elemental oxygen, molecular oxygen/$O_2$), water, hydrogen peroxide and nitrous oxide as a reactant gas at a deposition temperature above approximately 200° C. and below approximately 570° C., more preferably between approximately 265° C. and approximately 500° C. In yet a further aspect, the deposition temperature is preferably below approximately 340° C. In yet a further aspect, the deposition temperature is preferably between approximately 280° C. to approximately 300° C. In yet a further aspect, ozone is a preferred reactant gas. In yet a further aspect, water is a preferred reactant gas.

This summary section does not specify every embodiment and/or incrementally novel aspect of the disclosed and claimed subject matter. Instead, this summary only provides a preliminary discussion of different embodiments and corresponding points of novelty over conventional techniques and the known art. For additional details and/or possible perspectives of the disclosed and claimed subject matter and embodiments, the reader is directed to the Detailed Description section and corresponding figures of the disclosure as further discussed below.

The order of discussion of the different steps described herein has been presented for clarity sake. In general, the steps disclosed herein can be performed in any suitable order. Additionally, although each of the different features, techniques, configurations, etc. disclosed herein may be discussed in different places of this disclosure, it is intended that each of the concepts can be executed independently of each other or in combination with each other as appropriate. Accordingly, the disclosed and claimed subject matter can be embodied and viewed in many different ways.

BRIEF DESCRIPTION OF THE DRAWINGS

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter. In the drawings.

DEFINITIONS

Figure 1:
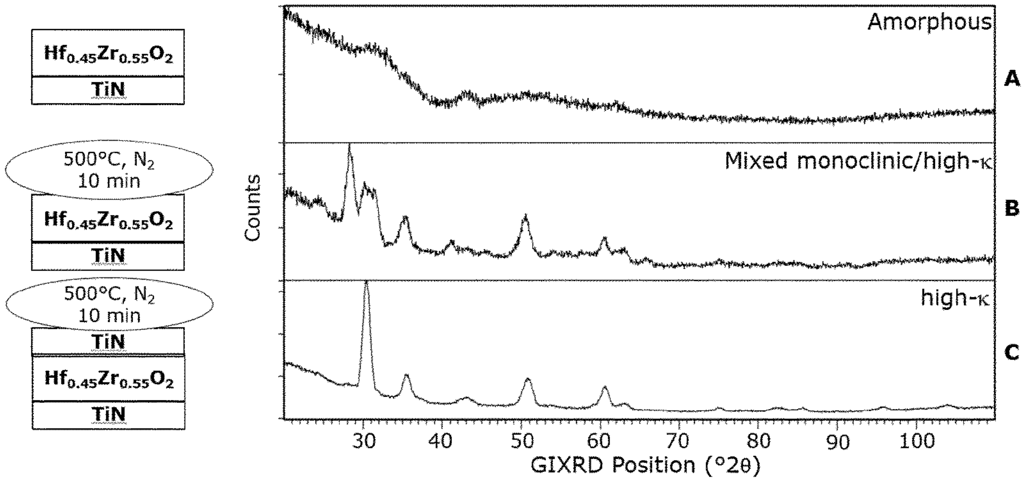
FIG. 1 illustrates the grazing-incidence x-ray diffraction pattern for a 7 nm thin film material composed of alternating atomic layer deposited $Hf_{0.45}Zr_{0.55}O_2$ from amide-type precursors and ozone at 285° C.

Unless otherwise stated, the following terms used in the specification and claims shall have the following meanings for this application.

In this application, the use of the singular includes the plural, and the words "a," "an" and "the" mean "at least one" unless specifically stated otherwise. Furthermore, the use of the term "including," as well as other forms such as "includes" and "included," is not limiting. Also, terms such as "element" or "component" encompass both elements or components including one unit and elements or components that include more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measurable numerical variable, refers to the indicated value of the variable and to all values of the variable that are within the experimental error of the indicated value (e.g., within the 95% confidence limit for the mean) or within percentage of the indicated value (e.g., ±10%, ±5%), whichever is greater.

For purposes of this invention and the claims hereto, the numbering scheme for the Periodic Table Groups is according to the IUPAC Periodic Table of Elements.

The term "and/or" as used in a phrase such as "A and/or B" herein is intended to include "A and B," "A or B," "A" and "B."

The terms "substituent," "radical," "group" and "moiety" may be used interchangeably.

As used herein, the terms "metal-containing complex" (or more simply, "complex") and "precursor" are used interchangeably and refer to a metal-containing molecule or compound which can be used to prepare a metal-containing film by a deposition process such as, for example, ALD or CVD. The metal-containing complex may be deposited on, adsorbed to, decomposed on, delivered to, and/or passed over a substrate or surface thereof, as to form a metal-containing film.

As used herein, the term "metal-containing film" includes not only an elemental metal film as more fully defined below, but also a film which includes a metal along with one or more elements, for example a metal nitride film, metal silicide film, a metal carbide film and the like.

As used herein, the terms "elemental metal," "elemental metal film" and "pure metal film" are used interchangeably and refer to a film which consists of, or consists essentially of, pure metal. For example, an elemental metal film may include 100% pure metal or the elemental metal film may include at least about 70%, at least about 80%, at least about 90%, at least about 95%, at least about 96%, at least about 97%, at least about 98%, at least about 99%, at least about 99.9%, or at least about 99.99% pure metal along with one or more impurities. However, a film comprising an elemental metal is distinguished from binary films including a metal and a non-metal (e.g., C, N, O) and ternary films including a metal and two non-metals (e.g., C, N, O), though, a film comprising elemental metal may include some amount of impurities. Unless context dictates otherwise, the term "metal film" shall be interpreted to mean an elemental metal film.

As used herein, the terms "deposition process" and "thermally depositing" are used to refer to any type of deposition technique, including but not limited to, CVD and ALD. In various embodiments, CVD may take the form of conventional (i.e., continuous flow) CVD, liquid injection CVD, plasma-enhanced CVD, or photo-assisted CVD. CVD may also take the form of a pulsed technique, i.e., pulsed CVD. ALD is used to form a metal-containing film by vaporizing and/or passing at least one metal complex disclosed herein over a substrate surface. For conventional ALD processes see, for example, George S. M., et al., *J. Phys. Chem.,* 1996, 100, 13121-13131. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Pro-*

*cesses, and Applications; Jones, A. C.; Hitchman, M. L., Eds. The Royal Society of Chemistry: Cambridge,* 2009; Chapter 1, pp 1-36.

Unless otherwise indicated, “alkyl” refers to hydrocarbon groups which can be linear, branched (e.g., methyl, ethyl, propyl, isopropyl, tert-butyl and the like), cyclic (e.g., cyclohexyl, cyclopropyl, cyclopentyl and the like) or multicyclic (e.g., norbornyl, adamantly and the like). Suitable acyclic groups can be methyl, ethyl, n- or iso-propyl, n-,iso, or tert-butyl, linear or branched pentyl, hexyl, heptyl, octyl, decyl, dodecyl, tetradecyl and hexadecyl. Unless otherwise stated, alkyl refers to 1-10 carbon atom moieties. The cyclic alkyl groups may be mono cyclic or polycyclic. Suitable examples of mono-cyclic alkyl groups include substituted cyclopentyl, cyclohexyl, and cycloheptyl groups. The substituents may be any of the acyclic alkyl groups described herein. As mentioned herein the cyclic alkyl groups may have any of the acyclic alkyl groups as substituent. These alkyl moieties may be substituted or unsubstituted.

“Halogenated alkyl” refers to a linear, cyclic or branched saturated alkyl group as defined above in which one or more of the hydrogens has been replaced by a halogen (e.g., F, Cl, Br and I). Thus, for example, a fluorinated alkyl (a.k.a. “fluoroalkyl”) refers to a linear, cyclic or branched saturated alkyl group as defined above in which one or more of the hydrogens has been replaced by fluorine (e.g., trifluoromethyl, pefluoroethyl, 2,2,2-trifluoroethyl, prefluoroisopropyl, perfluorocyclohexyl and the like). Such haloalkyl moieties (e.g., fluoroalkyl moieties), if not perhalogenated/multihalogentated, may be unsubstituted or further substituted.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that any of the incorporated literature and similar materials defines a term in a manner that contradicts the definition of that term in this application, this application controls.

DETAILED DESCRIPTION

It is to be understood that both the foregoing general description and the following detailed description are illustrative and explanatory, and are not restrictive of the subject matter, as claimed. The objects, features, advantages and ideas of the disclosed subject matter will be apparent to those skilled in the art from the description provided in the specification, and the disclosed subject matter will be readily practicable by those skilled in the art on the basis of the description appearing herein. The description of any “preferred embodiments” and/or the examples which show preferred modes for practicing the disclosed subject matter are included for the purpose of explanation and are not intended to limit the scope of the claims.

It will also be apparent to those skilled in the art that various modifications may be made in how the disclosed subject matter is practiced based on described aspects in the specification without departing from the spirit and scope of the disclosed subject matter disclosed herein.

I. Inherently Ferroelectric Materials

As set forth above, the disclosed and claimed subject matter relates to crystalline ferroelectric thin film materials that include a mixture of hafnium oxide and zirconium oxide having a substantial (i.e., approximately 40% or more) portion of the material in a ferroelectric phase and methods for preparing and depositing these materials. In a further aspect, the ferroelectric materials have a majority volume fraction of a ferroelectric phase. Significantly, these materials exhibit ferroelectric properties without the need for further processing, such as a subsequent capping step (as illustrated in FIG. 1) or annealing step. To be ferroelectric, the produced materials have one or more of (i) remanent polarization or (ii) a polarization field curve with hysteresis and a loop opening.

In order to be ferroelectric, the material must have an arrangement of atoms that can support ferroelectricity in some fraction of the film. It is preferable that a substantial portion of the volume of the film have an arrangement of atoms that can support ferroelectricity. It is understood that for thin films, doped materials, and some laminated materials, the phase distribution in the material may not be easily determined by x-ray diffraction. In this case, any other suitable technique for establishing the phase of the film, such as Raman spectroscopy, infrared spectroscopy, x-ray absorption spectroscopy, transmission electron microscopy, or combinations thereof, may be used to determine the phase distribution. For example, https://onlinelibrary.wiley.com/doi/full/10.1002/pssb.201900285 describes a technique for ascertaining the phase of a film to within approximately 10%.

The material can be comprised of any suitable molar ratio of hafnium oxide and zirconium oxide—ratios between 1:3 and 3:1 are preferred. The thickness of the ferroelectric material is any thickness that is suitable for the given application; the material can be made thicker to increase the remanent polarization or reduce the electrical leakage current through the thickness of the material, or be made thinner because of geometric constraints or to increase the capacitance of the film.

The preferred range of thicknesses for this invention is approximately 0.2 nm to approximately 20 nm and is more preferably approximately 0.2 nm to 10 nm. It is also preferable that the materials form films having a thickness of approximately 10 nm and less. In some embodiments it is preferable that the materials form films having a thickness of approximately 5 nm and less.

As discussed above, however, preferred and/or desired thicknesses will change depending on specific application. Thus, as noted previously, in some embodiments the materials exhibit ferroelectric properties as thin films of approximately 20 nm or less. In a further aspect the materials exhibit ferroelectric properties as thin films of approximately 15 nm or less. In a further aspect, the materials exhibit ferroelectric properties as thin films of approximately 10 nm or less. In a further aspect, the materials exhibit ferroelectric properties as thin films of approximately 5 nm or less. In a further aspect, the materials exhibit ferroelectric properties as thin films of approximately 3 nm or less. In a further aspect, the materials exhibit ferroelectric properties as thin films of approximately 1 nm or less. In a further aspect, the materials exhibit ferroelectric properties as thin films of approximately 0.5 nm or less. In a further aspect, the materials exhibit ferroelectric properties as thin films of approximately 0.2 nm or less. In a further aspect, the materials exhibit ferroelectric properties as thin films of between approximately 0.2 nm to approximately 20 nm. In a further aspect, the materials exhibit ferroelectric properties as thin films of between approximately 0.2 nm to approximately 15 nm. In a further aspect, the materials exhibit ferroelectric properties as thin films of between approximately 0.2 nm to approximately 10 nm. In a further aspect, the materials exhibit ferroelectric properties as thin films of between approximately 0.2 nm to approximately 5 nm. In a further aspect, the materials exhibit ferroelectric properties as thin films of between approximately 0.2 nm to approximately 3 nm. In a further aspect, the materials exhibit ferroelectric properties as thin films of between approximately 0.2 nm to approximately 1 nm. In a further aspect, the materials exhibit ferroelectric properties as thin films of between approximately 0.2 nm to approximately 1 nm.

In the disclosed and claimed materials, a substantial portion constituting approximately 40% or more of the crystalline material is in a ferroelectric phase, thus the total non-ferroelectric atomic arrangement components are less than approximately 60% of the total volume of the material. In another embodiment, the total non-ferroelectric atomic arrangement components are less than approximately 50% of the total volume of the material. In another embodiment, the total non-ferroelectric atomic arrangement components are less than approximately 40% of the total volume of the material. In another embodiment, the total non-ferroelectric atomic arrangement components are less than approximately 30% of the total volume of the material. In another embodiment, the total non-ferroelectric atomic arrangement components are less than approximately 25% of the total volume of the material. In another embodiment, the total non-ferroelectric atomic arrangement components are less than approximately 20% of the total volume of the material. In another embodiment, the total non-ferroelectric atomic arrangement components are less than approximately 15% of the total volume of the material. In another embodiment, the total non-ferroelectric atomic arrangement components are less than approximately 10% of the total volume of the material. In another embodiment, the total non-ferroelectric atomic arrangement components are less than approximately 5% of the total volume of the material.

Moreover, in the disclosed and claimed materials less than approximately 60% of the of the total volume of the material constitutes a non-ferroelectric monoclinic phase component. Thus, in one embodiment of the disclosed and claimed materials, a monoclinic phase component is less than approximately 50% of the total volume of the material. In another embodiment, a monoclinic phase component is less than approximately 40% of the total volume of the material. In another embodiment, a monoclinic phase component is less than approximately 30% of the total volume of the material. In another embodiment, a monoclinic phase component is less than approximately 25% of the total volume of the material. In another embodiment, a monoclinic phase component is less than approximately 20% of the total volume of the material. In another embodiment, a monoclinic phase component is less than approximately 15% of the total volume of the material. In another embodiment, a monoclinic phase component is less than approximately 10% of the total volume of the material. In another embodiment, a monoclinic phase component is less than approximately 5% of the total volume of the material. In yet another embodiment, greater than 50% of the total volume of the crystalline material is in a ferroelectric phase, less than 50% of the total volume of the crystalline material constitutes a non-ferroelectric phase component, and less than 25% of the total volume of the crystalline material constitutes a non-ferroelectric monoclinic phase component.

In the disclosed and claimed subject matter, the preferred carbon content of the material is below approximately 6 atomic percent as measured by a suitable technique, such as x-ray photo electron spectroscopy. In a further aspect, the carbon content below approximately 5 atomic percent. In a further aspect, the carbon content below approximately 4 atomic percent. In a further aspect, the carbon content below approximately 3 atomic percent. In a further aspect, the carbon content below approximately 2 atomic percent. In a further aspect, the carbon content below approximately 1 atomic percent. In a further aspect, the carbon content is between approximately 1 atomic percent and approximately 6 atomic percent. In a further aspect, the carbon content is between approximately 1 atomic percent and approximately 5 atomic percent. In a further aspect, the carbon content is between approximately 1 atomic percent and approximately 4 atomic percent. In a further aspect, the carbon content is between approximately 1 atomic percent and approximately 3 atomic percent. In a further aspect, the carbon content is between approximately 1 atomic percent and approximately 2 atomic percent.

The inherently ferroelectric materials are derived from metallocene precursor from advanced metallocene precursors having the Formula I ("($R^1$-Cp)($R^2$-Cp)-M-($OR^3$)($R^4$)" where Cp is a cyclopentadienyl group) and/or Formula II ("($R^5$-Cp)($R^6$-Cp)-M-($R^7$)($R^8$)" where Cp is a cyclopentadienyl group):

I

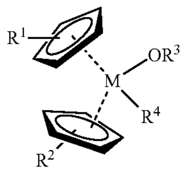

II

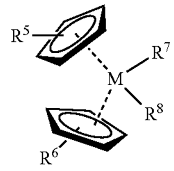

where: M=Zr or Hf; and $R^1$, $R^2$, $R^3$, $R^4$, $R^5$, $R^6$, $R^7$ and $R^8$ are each independently selected from a $C_1$-$C_6$ linear alkyl, a $C_1$-$C_6$ branched alkyl, a $C_1$-$C_6$ halogenated linear alkyl and a $C_1$-$C_6$ halogenated branched alkyl.

In another aspect, in Formula I each of $R^1$, $R^2$, $R^3$ and $R^4$ is preferably a $C_1$-$C_6$ linear alkyl. In a further aspect, in Formula I each of $R^1$, $R^2$, $R^3$ and $R^4$, is preferably the same $C_1$-$C_6$ linear alkyl. In a further aspect, in Formula I each of $R^1$, $R^2$, $R^3$ and $R^4$, is preferably a methyl group. In a further aspect, in Formula I each of $R^1$, $R^2$, $R^3$ and $R^4$, is preferably an ethyl group. In a further aspect, in Formula I each of $R^1$ and $R^2$, is preferably an ethyl group. In a further aspect, in Formula I each of $R^3$ and $R^4$, is preferably a methyl group. In a further aspect, in Formula I each of $R^1$ and $R^2$, is preferably an ethyl group and each of $R^3$ and $R^4$, is preferably a methyl group.

In another aspect, in Formula II each of $R^5$, $R^6$, $R^7$ and $R^8$ is preferably a $C_1$-$C_6$ linear alkyl. In a further aspect, in Formula II each of $R^5$, $R^6$, $R^7$ and $R^8$ is preferably the same $C_1$-$C_6$ linear alkyl. In a further aspect, in Formula II each of $R^5$, $R^6$, $R^7$ and $R^8$ is preferably a methyl group. In a further aspect, in Formula II each of $R^5$, $R^6$, $R^7$ and $R^8$ is preferably an ethyl group. In a further aspect, in Formula II each of $R^5$ and $R^6$ is preferably an ethyl group. In a further aspect, in Formula II each of $R^7$ and $R^8$ is preferably a methyl group.

In a further aspect, in Formula II each of $R^5$ and $R^6$ is preferably an ethyl group and each of $R^7$ and $R^8$ is preferably a methyl group.

In another aspect, in Formula I and Formula II each of $R^1$, $R^2$, $R^3$, $R^4$, $R^5$, $R^6$, $R^7$ and $R^8$ is preferably independently a $C_1$-$C_6$ linear alkyl. In a further aspect, in Formula I and Formula II each of $R^1$, $R^2$, $R^3$, $R^4$, $R^5$, $R^6$, $R^7$ and $R^8$ is preferably the same $C_1$-$C_6$ linear alkyl. In a further aspect, in Formula I and Formula II each of $R^1$, $R^2$, $R^3$, $R^4$, $R^5$, $R^6$, $R^7$ and $R^8$ is preferably a methyl group. In a further aspect, in Formula I and Formula II each of $R^1$, $R^2$, $R^3$, $R^4$, $R^5$, $R^6$, $R^7$ and $R^8$ is preferably an ethyl group. In a further aspect, in Formula I and Formula II each of $R^1$, $R^2$, $R^5$ and $R^6$ is preferably an ethyl group. In a further aspect, in Formula I and Formula II each of $R^3$, $R^4$, $R^7$ and $R^8$ is preferably a methyl group. In a further aspect, in Formula I and Formula II each of $R^1$, $R^2$, $R^5$ and $R^6$ is preferably an ethyl group and each of $R^3$, $R^4$, $R^7$ and $R^8$ is preferably a methyl group.

In another aspect, the advanced metallocene precursor is one or more of $(MeCp)_2Zr(OMe)Me$, $(MeCp)_2Hf(OMe)Me$, $(MeCp)_2Zr(Me)_2$, $(MeCp)_2Hf(Me)_2$, $(EtCp)_2Zr(OMe)Me$, $(EtCp)_2Hf(OMe)Me$, $(EtCp)_2Zr(Me)_2$, $(EtCp)_2Hf(Me)_2$, and combinations thereof.

In another aspect, the advanced metallocene precursor is one or more mixture of $(MeCp)_2Zr(OMe)Me$ and $(MeCp)_2Hf(OMe)Me$, a mixture of $(MeCp)_2Hf(Me)_2$ and $(MeCp)_2Hf(Me)_2$, $(EtCp)_2Zr(OMe)Me$ and $(EtCp)_2Hf(OMe)Me$ and a mixture of $(EtCp)_2Hf(Me)_2$ and $(EtCp)_2Hf(Me)_2$.

In another aspect, the advanced metallocene precursor is one or more of the precursors disclosed and/or claimed in U.S. Pat. No. 8,568,530 the contents of which is incorporated herein in its entirety.

II. Methods for Preparing and Depositing Inherently Ferroelectric Materials

As noted above, in another aspect the disclosed and claimed subject matter is directed to a process for preparing and/or depositing the inherently ferroelectric materials disclosed herein. In this process, the disclosed and claimed inherently ferroelectric materials are prepared by iterative depositions and purges (i) of a metallocene precursor and (ii) a reactant.

A. Metallocene Precursors

As noted above, the ferroelectric materials are derived from advanced metallocene precursors having the Formula I ("($R^1$-Cp)($R^2$-Cp)-M-($OR^3$)($R^4$)" where Cp is a cyclopentadienyl group) and/or Formula II ("($R^5$-Cp)($R^6$-Cp)-M-($R^7$)($R^8$)" where Cp is a cyclopentadienyl group):

I

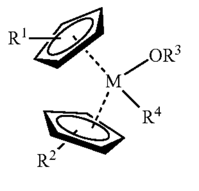

II

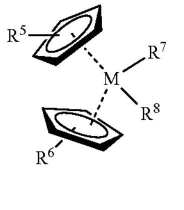

where: M=Zr or Hf; and $R^1$, $R^2$, $R^3$, $R^4$, $R^5$, $R^6$, $R^7$ and $R^8$ are each independently selected from a $C_1$-$C_6$ linear alkyl, a $C_1$-$C_6$ branched alkyl, a $C_1$-$C_6$ halogenated linear alkyl and a $C_1$-$C_6$ halogenated branched alkyl.

In another aspect, in Formula I each of $R^1$, $R^2$, $R^3$ and $R^4$, is preferably a $C_1$-$C_6$ linear alkyl. In a further aspect, in Formula I each of $R^1$, $R^2$, $R^3$ and $R^4$, is preferably the same $C_1$-$C_6$ linear alkyl. In a further aspect, in Formula I each of $R^1$, $R^2$, $R^3$ and $R^4$ is preferably a methyl group. In a further aspect, in Formula I each of $R^1$, $R^2$, $R^3$ and $R^4$, is preferably an ethyl group. In a further aspect, in Formula I each of $R^1$ and $R^2$, is preferably an ethyl group. In a further aspect, in Formula I each of $R^3$ and $R^4$, is preferably a methyl group. In a further aspect, in Formula I each of $R^1$ and $R^2$, is preferably an ethyl group and each of $R^3$ and $R^4$, is preferably a methyl group.

In another aspect, in Formula II each of $R^5$, $R^6$, $R^7$ and $R^8$ is preferably a $C_1$-$C_6$ linear alkyl. In a further aspect, in Formula II each of $R^5$, $R^6$, $R^7$ and $R^8$ is preferably the same $C_1$-$C_6$ linear alkyl. In a further aspect, in Formula II each of $R^5$, $R^6$, $R^7$ and $R^8$ is preferably a methyl group. In a further aspect, in Formula II each of $R^5$, $R^6$, $R^7$ and $R^8$ is preferably an ethyl group. In a further aspect, in Formula II each of $R^5$ and $R^6$ is preferably an ethyl group. In a further aspect, in Formula II each of $R^7$ and $R^8$ is preferably a methyl group. In a further aspect, in Formula II each of $R^5$ and $R^6$ is preferably an ethyl group and each of $R^7$ and $R^8$ is preferably a methyl group.

In another aspect, in Formula I and Formula II each of $R^1$, $R^2$, $R^3$, $R^4$, $R^5$, $R^6$, $R^7$ and $R^8$ is preferably independently a $C_1$-$C_6$ linear alkyl. In a further aspect, in Formula I and Formula II each of $R_1$, $R_2$, $R_3$, $R_4$, $R_5$, $R_6$, $R^7$ and $R^8$ is preferably the same $C_1$-$C_6$ linear alkyl. In a further aspect, in Formula I and Formula II each of $R^1$, $R^2$, $R^3$, $R^4$, $R^5$, $R^6$, $R^7$ and $R^8$ is preferably a methyl group. In a further aspect, in Formula I and Formula II each of $R^1$, $R^2$, $R^3$, $R^4$, $R^5$, $R^6$, $R^7$ and $R^8$ is preferably an ethyl group. In a further aspect, in Formula I and Formula II each of $R^1$, $R^2$, $R^5$ and $R^6$ is preferably an ethyl group. In a further aspect, in Formula I and Formula II each of $R^3$, $R^4$, $R^7$ and $R^8$ is preferably a methyl group. In a further aspect, in Formula I and Formula II each of $R^1$, $R^2$, $R^5$ and $R^6$ is preferably an ethyl group and each of $R^3$, $R^4$, $R^7$ and $R^8$ is preferably a methyl group.

In another aspect, the advanced metallocene precursor is one or more of $(MeCp)_2Zr(OMe)Me$, $(MeCp)_2Hf(OMe)Me$, $(MeCp)_2Zr(Me)_2$, $(MeCp)_2Hf(Me)_2$, $(EtCp)_2Zr(OMe)Me$, $(EtCp)_2Hf(OMe)Me$, $(EtCp)_2Zr(Me)_2$, $(EtCp)_2Hf(Me)_2$, and combinations thereof.

In another aspect, the advanced metallocene precursor is one or more mixture of $(MeCp)_2Zr(OMe)Me$ and $(MeCp)_2Hf(OMe)Me$, a mixture of $(MeCp)_2Hf(Me)_2$ and $(MeCp)_2Hf(Me)_2$, $(EtCp)_2Zr(OMe)Me$ and $(EtCp)_2Hf(OMe)Me$ and a mixture of $(EtCp)_2Hf(Me)_2$ and $(EtCp)_2Hf(Me)_2$.

In another aspect, the advanced metallocene precursor is one or more of the precursors disclosed and/or claimed in U.S. Pat. No. 8,568,530 the contents of which is incorporated herein in its entirety.

In general, suitable precursors for preparing the inherently ferroelectric materials are able to be deposited at or near the crystallization temperature of the desired ferroelectric material, typically between approximately 200° C. and approximately 570° C. depending on the composition of the material, substrate, and reactor design, among other factors. A preferred temperature is approximately 300° C. (or generally between approximately 280° C. and approximately 300° C.), and the preferred temperature range is below approximately 450° C. and more preferably below approximately 340° C. However, those skilled in the art should recognize that other temperatures may be possible depending on the specific precursor used and that such precursors also fall within the scope of the disclosed and claimed subject matter. It should further be noted that with certain precursors besides the ones listed here, decomposition of the precursor can occur within the temperature range described. Decomposition products, in particular carbon and organic species, can become incorporated in the deposited hafnium oxide or zirconium oxide material. While this incorporation of carbon may assist with the stabilization of the ferroelectric phase, it may be undesirable for material purity reasons. Thus, as discussed above, the preferred carbon content of the material is below approximately 6 atomic percent.

B. Reactant

The reactant is a reaction gas containing one or more of oxygen (e.g., ozone, elemental oxygen, molecular oxygen/$O_2$), water, hydrogen peroxide and nitrous oxide. In one embodiment, ozone is a preferred reactant gas. In another embodiment, water is a preferred reactant gas.

C. Process Steps

An aspect of the disclosed and claimed subject matter is a method for depositing the crystalline material including:

(i) providing a substrate at a deposition temperature;

(ii) exposing the substrate to a first precursor that does not decompose at the deposition temperature;

(iii) exposing the substrate to a first reaction gas;

(iv) exposing the substrate to a second precursor that does not decompose at the deposition temperature; and (v) exposing the substrate to a second reaction gas, wherein one of the first precursor and the second precursor includes zirconium and the other of the first precursor and the second precursor includes hafnium. In some embodiments, the method further includes at least one purging step.

In one embodiment, the first reaction gas and the second reaction gas are each independently a gas containing one or more of oxygen, water, hydrogen peroxide and nitrous oxide. In another embodiment, the first reaction gas and the second reaction gas are each independently a gas containing oxygen. In another embodiment, the first reaction gas and the second reaction gas are each independently a gas containing ozone. In another embodiment, the first reaction gas and the second reaction gas are each independently a gas containing water. In another embodiment, the first reaction gas and the second reaction gas are the same gas. In another embodiment, the first reaction gas and the second reaction gas are different gases.

In one embodiment, the first precursor and the second precursor are each independently a precursor having Formula I or Formula II as described above.

In one embodiment, the method comprises an ALD process. In another embodiment, the method comprises a CVD process.

In one embodiment, the crystalline material deposited in the method of the invention has a thickness between approximately 0.2 nm and approximately 20 nm.

In one embodiment, the crystalline material deposited in the disclosed and claimed method exhibits remanent polarization without additional thermal processing. In another embodiment, the crystalline material deposited in the disclosed and claimed method has a remanent polarization (Pr) of greater than 8 $\mu C/cm^2$ or a total loop opening of greater than 16 $\mu C/cm^2$. In another embodiment, the crystalline material deposited in the disclosed and claimed method has hysteresis and remanent polarization in a polarization-electric field measurement.

Figure 2:
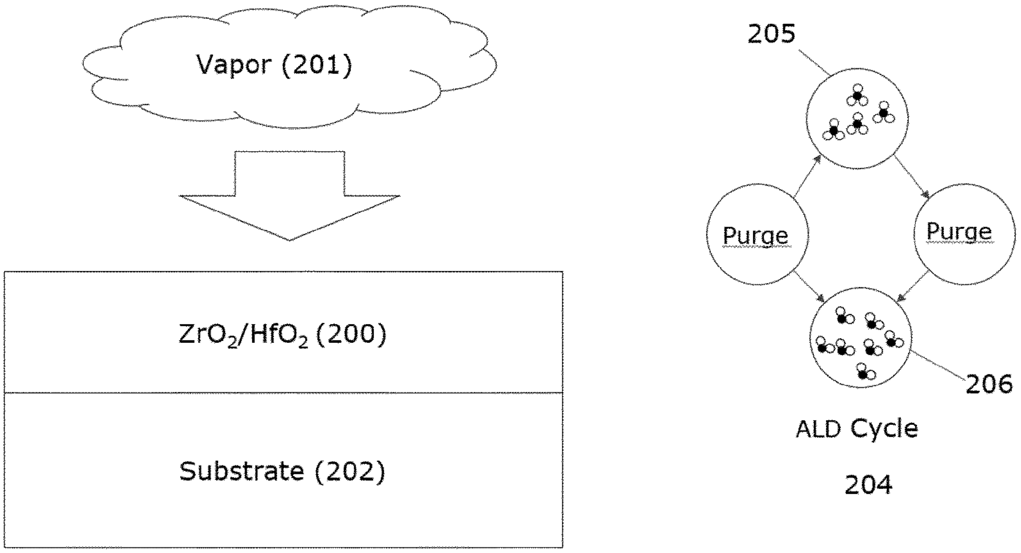
FIG. 2 illustrates an embodiment of a process for depositing an example of the inherently ferroelectric materials disclosed herein on a substrate.

FIG. 2 illustrates an embodiment of a process for preparing and depositing the inherently ferroelectric materials described herein. As illustrated, substrate 202 undergoes an ALD cycle 204 in which substrate 202 is exposed to vapor 201 to form and deposit an inherently ferroelectric material as thin film layer 200. Layer 200 was formed without further thermal processing or capping and exhibited ferroelectric properties as such (i.e., as deposited). Those skilled in the art recognize, of course, that layer 200 could be subsequently annealed and/or capped as desired but that doing so was not necessary to observe ferroelectric behavior of the layer as deposited. For example, energy can subsequently be applied to the material by, but not limited to, thermal, plasma, pulsed plasma, helicon plasma, high density plasma, inductively coupled plasma, X-ray, e-beam, photon, remote plasma methods, and combinations thereof.

The constituents of vapor 201 change during ALD cycle 204. In particular, substrate 202 is alternatingly exposed to metallocene precursor 205 followed by a purge and then exposed to reactant 206 followed by another purge. This process continues until a desired thickness for layer 200 is obtained. Although ALD is a preferred vapor deposition technique, any suitable vapor phase deposition technique can be utilized, such as CVD or pulsed CVD. Thus, for example, in FIG. 2 ALD cycle 204 could be replaced by a CVD process in which metallocene precursor 205 and reactant 206 are provided as a mixture in vapor 201 and provided simultaneously to substrate 202.

An appropriate molar ratio of hafnium oxide to zirconium oxide can be created by several methods, including introducing a hafnium-containing precursor during a fraction of these cycles, and a zirconium-containing precursor during other cycles. The cycles could alternate, be grouped together, or arranged in any other suitable sequence to produce the overall desired molar ratio, as both intimately blended materials and nanolaminated materials have been shown to have desirable ferroelectric properties. It should be noted that other elements may be added into the hafnium oxide-zirconium oxide material by adding appropriate precursors either along with the hafnium and zirconium precursors, or in separate cycles.

The substrate, e.g. substrate 202, on which the inherently ferroelectric material is formed, e.g. as layer 200, can include any suitable material, including semiconducting materials like silicon, germanium, group materials, transition metal dichalcogenides, and mixtures thereof, metals and conductive ceramics like titanium nitride, titanium, tantalum, tantalum nitride, tungsten, platinum, rhodium, molybdenum, cobalt, ruthenium, palladium, or mixtures thereof, or dielectrics like silicon oxide, silicon nitride, aluminum oxide, titanium oxide, other ferroelectric materials, including compositions of hafnium oxide and zirconium oxide, magnetic materials, and mixtures or stacks thereof.

Optionally, substrate 202 can be patterned or textured, as appropriate, with any suitable topography, including flat surfaces, trenches, vias, or nanostructured surfaces. This list represents typical substrates that may be useful in ferroelectric applications, but should not be considered limiting, as many other suitable compositions and surface patterns would be obvious to those skilled in the art. In this regard, it is known that the substrate can have some influence on the atomic arrangement and phase of the film formed thereon, including affecting the crystalline orientation and crystallization temperature of the film. Regardless of the particular substrate and the extent of this effect, the inherently ferroelectric materials described herein and deposited on such substrates nevertheless have a substantial fraction of their volume in the ferroelectric phase as deposited.

Figure 3:
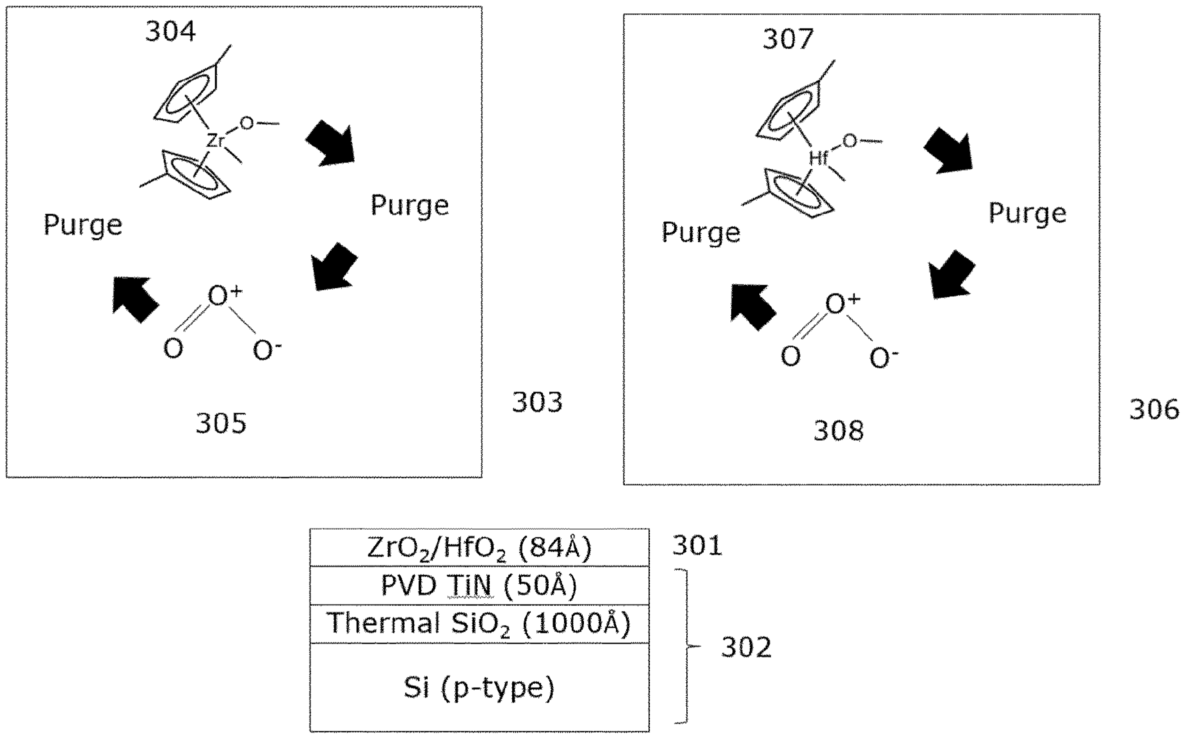
FIG. 3 illustrates another embodiment of a process for depositing an example of the inherently ferroelectric materials disclosed herein on a substrate.

FIG. 3 illustrates another embodiment of a process for preparing and depositing the inherently ferroelectric materials descried herein. In this embodiment, a mixed hafnium oxide and zirconium oxide inherently ferroelectric material is prepared and deposited as layer 301 with a thickness of approximately 8.4 nm is on a stacked substrate 302 of PVD TiN (which is in direct contact with the ferroelectric material), a thermally grown $SiO_2$ layer and a Si wafer. Layer 301 was formed without further thermal processing or capping. In this embodiment, the molar ratio of hafnium oxide to zirconium oxide is approximately 1:1, with a margin of error of approximately 10%. The ferroelectric material is prepared and deposited as layer 301 from the vapor by ALD by alternating First Cycle 303 (which includes the steps of (i) pulsing $(MeCp)_2Zr(OMe)Me$ 304, (ii) purging, (iii) pulsing ozone 305 and (iv) purging) and Second Cycle 306 (which includes the steps of (i) pulsing $(MeCp)_2Hf(OMe)Me$ 307, (ii) purging, (iii) pulsing ozone 308 and (iv) purging).

Those skilled in the art will recognize that other precursors, such as $(MeCp)_2HfMe_2$ and $(MeCp)_2ZrMe_2$ and other reactants, such as water, hydrogen peroxide or oxygen plasma, may also or alternatively be used. Those skilled in the art will further recognize that the pulsing and purging times can each respectively vary depending on equipment. In one embodiment, pulses last from approximately 2 to approximately 3 seconds followed by a purge of approximately 10 seconds. In another embodiment, pulses last from approximately 10 to approximately 15 seconds followed by a purge of approximately 30 seconds to approximately 60 seconds. In another embodiment, the order in which the precursors are deposited can be reversed.

Figure 4:
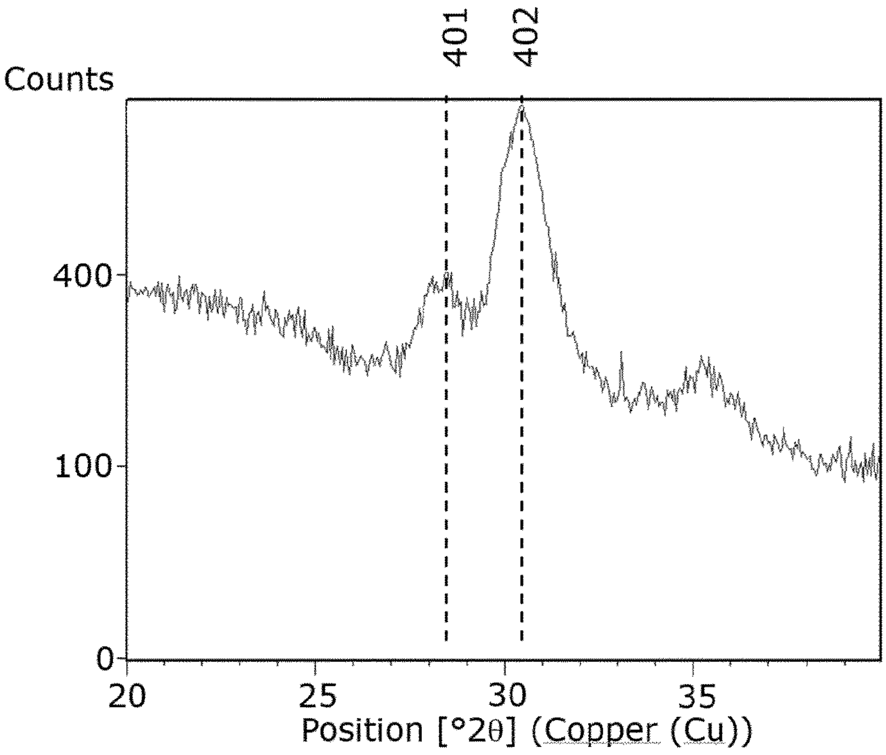
FIG. 4 illustrates the grazing-incidence XRD pattern for the inherently ferroelectric materials formed and deposited in the process illustrated in FIG. 3.

FIG. 4 illustrates the grazing-incidence XRD pattern for the inherently ferroelectric material prepared and deposited as layer 301 in FIG. 3 without further thermal processing or capping. As shown in FIG. 4, the crystalline peaks of the material constituting layer 301 show monoclinic 401 and non-monoclinic 402 components. By fitting the peaks and using the peak areas with the technique described by McBriarty et al., https://onlinelibrary.wiley.com/doi/full/10.1002/pssb.201900285, the calculated monoclinic fraction of the volume of the of the material constituting layer 301 is less than 25%, which is the preferred maximum volume fraction of monoclinic, non-ferroelectric material.

Figure 5:
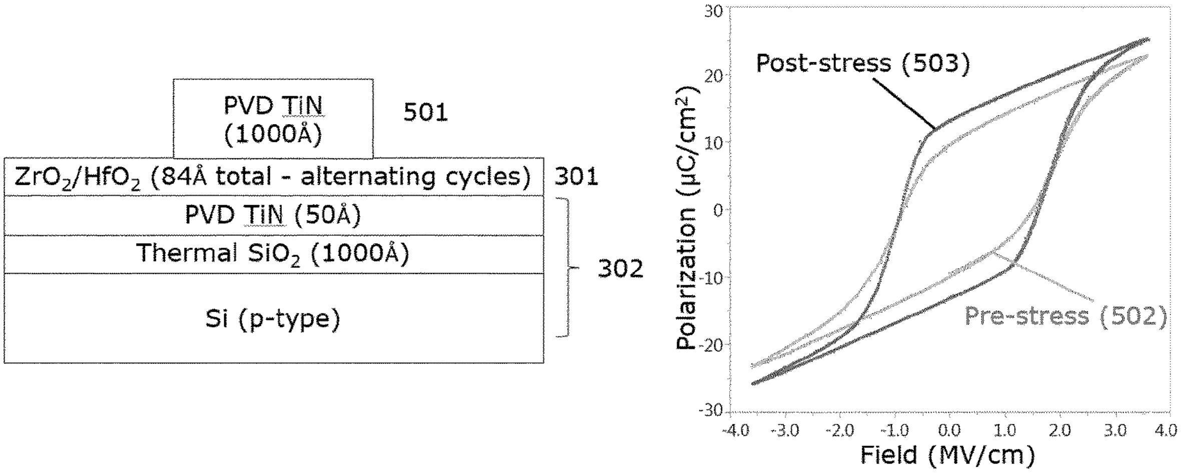
FIG. 5 illustrates the polarization-electric field plot for the inherently ferroelectric materials formed and deposited in the process illustrated in FIG. 3 as measured using a radiant ferroelectric tester.

FIG. 5 illustrates the polarization-electric field plot for the inherently ferroelectric materials formed and deposited in the process illustrated in FIG. 3 as measured using a radiant ferroelectric tester. A top electrode contact was formed on top of the ferroelectric material by applying PVD TiN through shadow mask 501. First curve 502 is measured using a triangular bipolar waveform from −3V to 3V in steps of 0.25V with a frequency of 250 Hz and a period of 8 ms. First curve 502 shows a clear opening, demonstrating a remanent (non-zero) polarization at 0V and therefore ferroelectric behavior. Second curve 503 shows a larger remanent polarization from the same device after the application of 1000 cycles of a bipolar square waveform from −3V to 3V with a period of 1 ms and a frequency of 1 kHz. This behavior is common in ferroelectric materials comprising hafnium oxide and zirconium oxide. It should be noted that polarization-electric field curves are not required for all applications; other techniques, such as piezo force microscopy or optical experiments, could also establish ferroelectricity.

Figure 6:
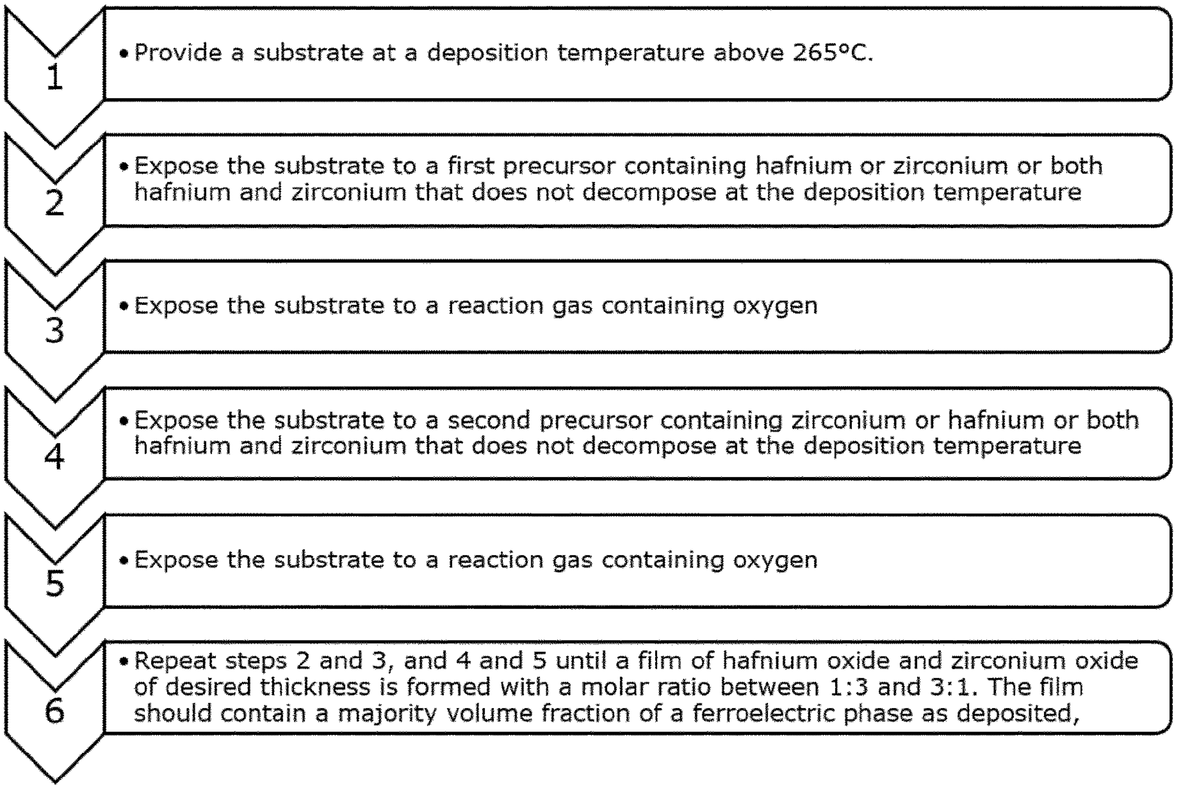
FIG. 6 illustrates another embodiment of a process for depositing an example of the inherently ferroelectric materials disclosed herein on a substrate.
Figure 7A:
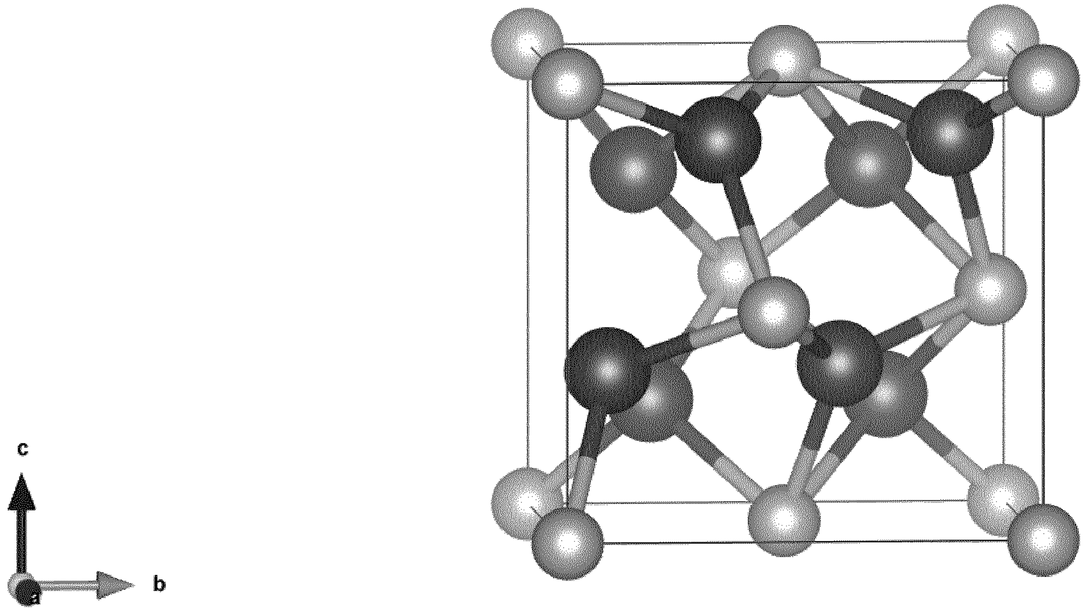
FIG. 7A (Related Art)
FIG. 7A-D illustrate known crystalline phases: monoclinic $P2_1/c$ (FIG. 7A); orthorhombic Pca $2_1$ (FIG. 7B) rhombohedral R3 (FIG. 7C) and tetragonal $P4_2/nmc$ (FIG. 7D).
Figure 7B:
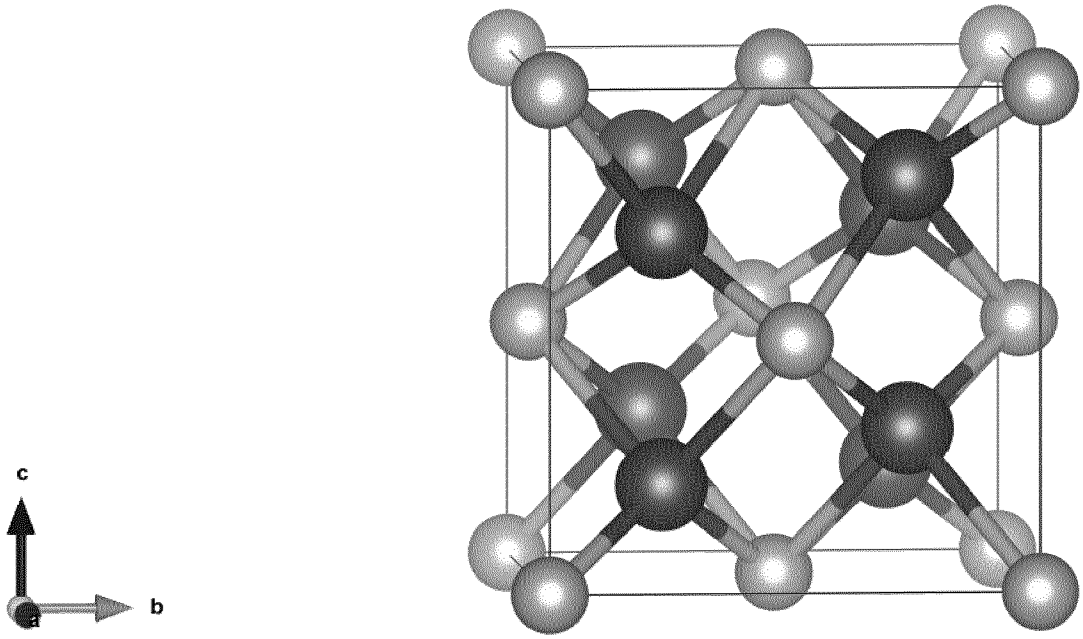
FIG. 7B (Related Art)
Figure 7C:
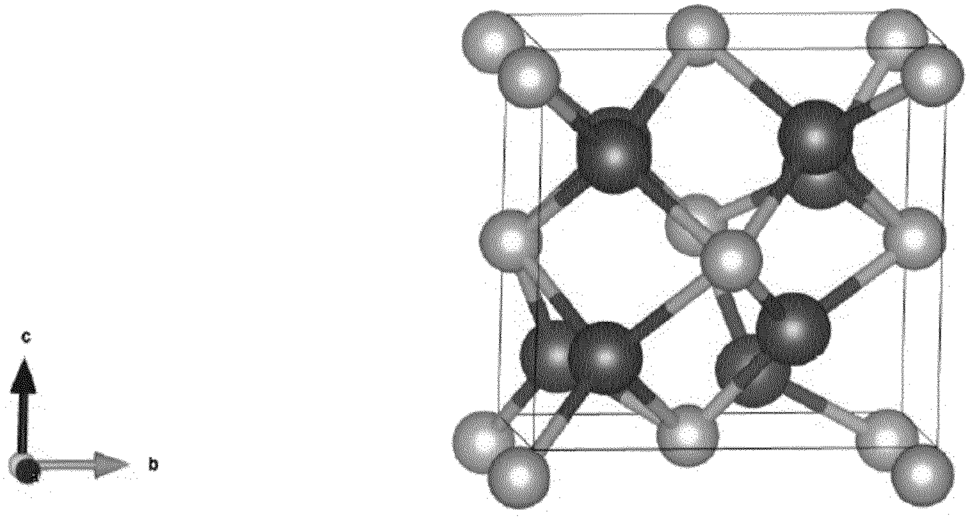
FIG. 7C (Related Art)
Figure 7D:
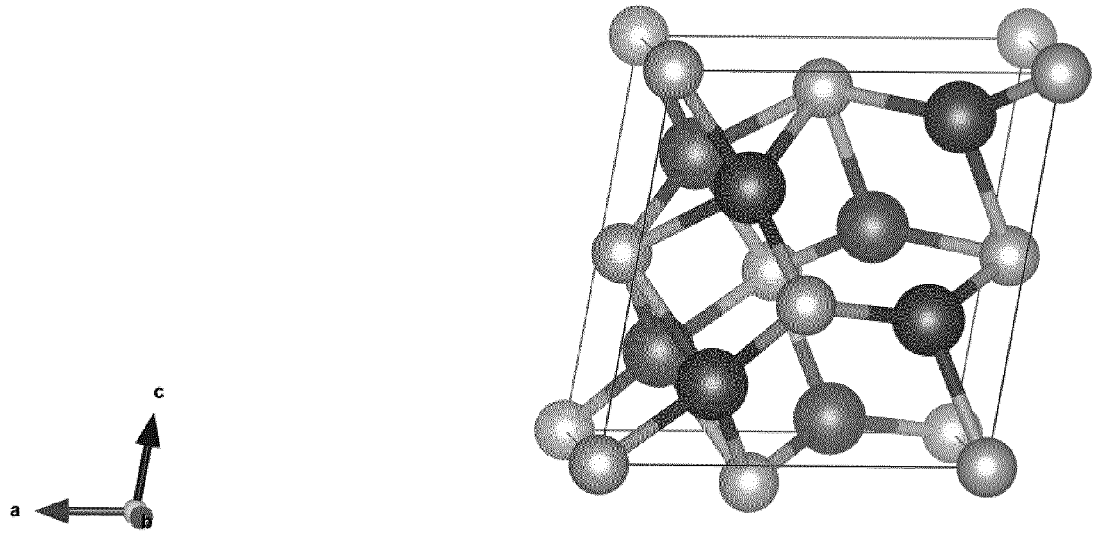
FIG. 7D (Related Art)

FIG. 6 illustrates another embodiment of a process for preparing and depositing the inherently ferroelectric materials descried herein using ALD. The method includes several steps that can be augmented with additional and/or optional steps. Step 1 includes providing a substrate at a deposition temperature of between approximately 265° C. and approximately 500° C., but that is preferably at or around approximately 300° C. (e.g., above approximately 285° C. and at or below approximately 300° C.) and below 340° C. Step 2 includes (i) exposing the substrate to a first precursor containing hafnium or zirconium or both hafnium and zirconium that does not decompose at the deposition temperature and (ii) purging. Step 3 includes (i) exposing the substrate to a reaction gas containing oxygen and (ii) purging. Step 4 includes (i) exposing the substrate to a second precursor containing zirconium or hafnium or both hafnium and zirconium that does not decompose at the deposition temperature and (ii) purging. Step 5 includes exposing the substrate to a reaction gas containing oxygen. Optional Step 6 includes repeating Steps 2-5 until a film of hafnium oxide and zirconium oxide of desired thickness is formed with a molar ratio between approximately 1:3 and approximately 3:1.

In the process of FIG. 6, the inherently ferroelectric materials are formed and deposited as films having a substantial volume fraction of a ferroelectric phase as deposited (i.e., without further annealing and/or capping) and as measured by a phase determining technique or electrical testing known to those skilled in the art (e.g., XRD, XAS, TEM, polarization-voltage testing, piezo force microscopy, or combinations thereof). The metallocene precursors utilized and/or that can be utilized in the process of FIG. 6 include all of those disclosed and discussed above and include, in particular, $(MeCp)_2Zr(OMe)Me$, $(MeCp)_2Hf(OMe)Me$, $(MeCp)_2Zr(Me)_2$ and $(MeCp)_2Hf(Me)_2$. The reaction gas containing oxygen of Step 3 and/or Step 5 is preferably ozone. Those skilled in the art will recognize that other reaction gases can be used including those specifically described above (e.g., water, hydrogen peroxide).

Another aspect of the disclosed and claimed subject matter is a thin film including the thin film crystalline material as described above. In one embodiment, the film has a thickness of approximately 0.2 nm to approximately 10 nm. In another embodiment, the film has a thickness of approximately 0.2 nm to approximately 5 nm. In another embodiment, the film has a thickness of approximately 0.2 nm to approximately 1 nm. In another embodiment, the film has a thickness of approximately 0.2 nm to approximately 0.5 nm. In another embodiment, the film has a thickness of approximately 15 nm or less. In another embodiment, the film has a thickness of approximately 10 nm or less. In another embodiment, the film has a thickness of approximately 5 nm or less. In another embodiment, the film has a thickness of approximately 3 nm or less. In another embodiment, the film has a thickness of approximately 1 nm or less. In some embodiments, the film has a remanent polarization (Pr) of greater than 8 $\mu C/cm^2$ or a total loop opening of greater than 16 $\mu C/cm^2$.

Another aspect of the disclosed and claimed subject matter is the use of the thin film crystalline material as described above for forming a thin film that exhibits ferroelectric behavior.

Another aspect of the disclosed and claimed subject matter is the use of the thin film as described above as a ferroelectric material in a computing device.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials and Methods

The metallocene precursors were or otherwise can be prepared according to U.S. Pat. No. 8,568,530 the contents of which is incorporated herein in its entirety.

The material was deposited in a Cambridge Nanotech Savannah 200 mm cross-flow ALD reactor with a substrate temperature of 300° C. and an outer ring temperature of 290° C. A substrate consisting of a 45 mm×45 mm p-type Si wafer covered with 1000 ∈ of thermally grown silicon oxide and a 5 nm PVD TiN layer sputtered at 250° C. in an Applied Materials 200 mm Endura PVD tool. To deposit 8.4 nm of mixed $ZrO_2$ and $HfO_2$, 95 ALD cycles of $(MeCp)_2Zr(OMe)Me$ and ozone and 95 cycles of $(MeCp)_2Hf(OMe)Me$ and ozone were used, alternating between the two types of cycles. Ozone was provided using an InUSA ozone generator, model AC-2025, set to 200 g/m$^3$ of ozone. The oxygen flow going into the ozone generator is approximately 300 sccm. There is a needle valve between the ozone supply, and the reactor chamber, which modulates the flow of ozone. The ampule temperatures were 125° C., the precursor doses were 3 seconds, the reactant doses were 2 seconds, and the purges were 10 seconds. The base pressure is maintained at an average pressure between 0.37 to 0.42 Torr during purge steps, between 0.42 and 0.48 Torr during precursor pulses, and between 1 and 1.5 Torr during reactant pulses. The process can employ intermittently or consistently higher pressures. In one embodiment, for example, a maximum instantaneous pressure of 6 Torr during the first few pulses of ozone was employed.

After deposition, the films were characterized by grazing-incidence XRD on a Bruker D8 Discover diffractometer using a monochromated Cu X-ray tube (Cu Kα, λ=1.5418 Å). The incident beam angle was fixed at 0.7°, and XRD patterns were collected over the range 2θ 20°-40° in 0.05° steps using a position-sensitive detector. For ferroelectric testing, TiN top contacts (100 nm thick) were deposited by PVD at 250° C. (i.e., at a non-annealing temperature below the temperature for ALD growth) in an Applied Materials Endura PVD tool. The circular contacts (0.305 mm diameter; 0.073 mm$^2$m area) were defined by a shadow mask. Polarization curves were collected using a Radiance Precision II ferroelectric tester and a Cascade probe station. Polarization field data were collected with a bipolar triangular waveform (0.25 kHz, −3V to 3V in 0.25V steps) before and after applying a wake-up stress of ±3 V at 1 kHz for 1 s. As shown in FIG. 5, the as-deposited layer has remanent polarization (Pr) of greater than 8 μC/cm$^2$, or a total loop opening of greater than 16 μC/cm$^2$, when measured using triangular bipolar waveform with a maximum applied field of approximately 3.8M V/cm.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

What is claimed is:

1. A thin film crystalline material consisting essentially of hafnium oxide and zirconium oxide, wherein the crystalline material exhibits ferroelectric behavior as deposited; and wherein the crystalline material is derived from one or more metallocene precursor having Formula I:

I

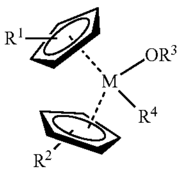

or Formula II:

II

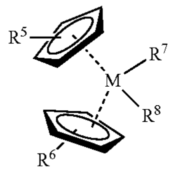

wherein (i) M is selected from Zr and Hf and (ii) $R^1$, $R^2$, $R^3$, $R^4$, $R^5$, $R^6$, $R^7$ and $R^8$ are each independently selected from a $C_1$-$C_6$ linear alkyl, a $C_1$-$C_6$ branched alkyl, a $C_1$-$C_6$ halogenated linear alkyl and a $C_1$-$C_6$ halogenated branched alkyl;

wherein the crystalline material has a carbon content below approximately 1 atomic percent or wherein the crystalline material has a carbon content between approximately 1 atomic percent and approximately 6 atomic percent; and wherein (i) greater than 40% of the total volume of the crystalline material is in a ferroelectric phase; and (ii) less than 60% of the total volume of the crystalline material constitutes a non-ferroelectric phase component.

2. The crystalline material of claim 1, wherein a hafnium oxide to zirconium oxide ratio is between approximately 1:3 and approximately 3:1.

3. The crystalline material of claim 1, wherein the crystalline material has a carbon content below approximately 1 atomic percent.

4. The crystalline material of claim 1, wherein the crystalline material has a carbon content between approximately 1 atomic percent and approximately 6 atomic percent.

5. The crystalline material of claim 1, wherein the crystalline material is derived from one or more metallocene precursor having Formula I:

I

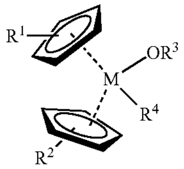

or Formula II:

II

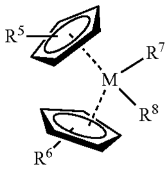

wherein (i) M is selected from Zr and Hf and (ii) $R^1$, $R^2$, $R^3$, $R^4$, $R^5$, $R^6$, $R^7$ and $R^8$ are each independently a $C_1$-$C_6$ linear alkyl.

6. The crystalline material of claim 1, wherein the crystalline material is derived from one or more metallocene precursor having Formula I:

I

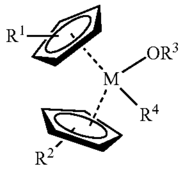

or Formula II:

II

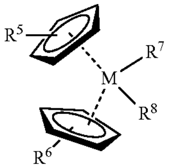

wherein (i) M is selected from Zr and Hf and (ii) $R^1$, $R^2$, $R^3$, $R^4$, $R^5$, $R^6$, $R^7$ and $R^8$ are each a methyl group.

7. A thin film comprising the material of claim 1, wherein the film has a thickness of approximately 0.2 nm to approximately 10 nm.

8. A thin film comprising the material of claim 1, wherein the film has a remanent polarization (Pr) of greater than 8 $\mu C/cm^2$ or a total loop opening of greater than 16 $\mu C/cm^2$.

9. A method for depositing the crystalline material a material of claim 1 comprising:

(i) providing a substrate at a deposition temperature;

(ii) exposing the substrate to a first precursor that does not decompose at the deposition temperature;

(iii) exposing the substrate to a first reaction gas;

(iv) exposing the substrate to a second precursor that does not decompose at the deposition temperature; and (v) exposing the substrate to a second reaction gas, wherein one of the first precursor and the second precursor comprises zirconium and the other of the first precursor and the second precursor comprises hafnium.

10. The method of claim 9, wherein the deposited crystalline material has a thickness of approximately 0.2 nm and approximately 20 nm.

11. The method of claim 9, wherein the deposited crystalline material has a remanent polarization (Pr) of greater than 8 $\mu C/cm^2$ or a total loop opening of greater than 16 $\mu C/cm^2$.

* * * * *